(12) United States Patent
Wang et al.

(10) Patent No.: US 11,101,013 B2
(45) Date of Patent: Aug. 24, 2021

(54) SHIFT REGISTER, METHOD FOR FABRICATING INVERTER, GATE DRIVING CIRCUIT, AND DISPLAY DEVICE

(71) Applicants: Beijing BOE Display Technology Co., Ltd., Beijing (CN); BOE Technology Group Co., Ltd., Beijing (CN)

(72) Inventors: Xiao Wang, Beijing (CN); Yu Ma, Beijing (CN); Yan Yan, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 155 days.

(21) Appl. No.: 16/197,460

(22) Filed: Nov. 21, 2018

(65) Prior Publication Data

US 2019/0371422 A1 Dec. 5, 2019

(30) Foreign Application Priority Data

May 30, 2018 (CN) .......................... 201810540401.4

(51) Int. Cl.
*G11C 19/00* (2006.01)
*G11C 19/28* (2006.01)
(Continued)

(52) U.S. Cl.
CPC ............. *G11C 19/287* (2013.01); *G09G 3/20* (2013.01); *G09G 3/3677* (2013.01); *G11C 19/28* (2013.01);
(Continued)

(58) Field of Classification Search
None
See application file for complete search history.

(56) References Cited

U.S. PATENT DOCUMENTS 8,663,888 B2 * 3/2014 Shitara ................. G03G 9/0819
430/109.4
8,766,958 B2 * 7/2014 Zhang ................. G09G 3/3677
345/204
(Continued)

FOREIGN PATENT DOCUMENTS

CN 100397446 C 6/2008
CN 102867543 * 1/2013
(Continued)

OTHER PUBLICATIONS

Chinese Office Action for corresponding application 201810540401.4 dated Dec. 16, 2020.

*Primary Examiner* — Tuan T Lam
(74) *Attorney, Agent, or Firm* — Arent Fox LLP; Michael Fainberg (57) ABSTRACT

Disclosed are a shift register, a method for fabricating an inverter, a gate driving circuit, and a display device, and the shift register includes a first pull-down circuit, a second pull-down circuit, and a first inverter, where the first pull-down circuit is configured to operate under the control of a first level of a power source terminal, and to be disabled under the control of a second level of the power source terminal; and the first inverter is configured to provide the second pull-down circuit with a signal of a first signal terminal under the control of the first level of the power source terminal to disable the second pull-down circuit, and to provide the second pull-down circuit with a signal of a second signal terminal under the control of the second level of the power source terminal to drive the second pull-down circuit to operate.

16 Claims, 7 Drawing Sheets

(51) Int. Cl.
*G09G 3/20* (2006.01)
*G09G 3/36* (2006.01)

(52) U.S. Cl.
CPC . *G09G 2310/0286* (2013.01); *G09G 2310/08* (2013.01); *G09G 2330/02* (2013.01)

(56) References Cited

U.S. PATENT DOCUMENTS

| | | | | |
|---|---|---|---|---|
| 9,190,169 | B2* | 11/2015 | Han | G09G 3/3611 |
| 2002/0167026 | A1* | 11/2002 | Azami | G09G 3/3688 257/200 |
| 2006/0139293 | A1* | 6/2006 | Cho | G09G 3/3677 345/100 |
| 2006/0290390 | A1* | 12/2006 | Jang | G11C 19/28 327/112 |
| 2007/0001991 | A1* | 1/2007 | Jang | G09G 3/3677 345/100 |
| 2007/0104307 | A1* | 5/2007 | Kim | G11C 19/28 377/64 |
| 2008/0219401 | A1* | 9/2008 | Tobita | G09G 3/3677 377/79 |
| 2009/0304138 | A1* | 12/2009 | Tsai | G11C 19/28 377/79 |
| 2010/0156858 | A1* | 6/2010 | Moon | G11C 19/28 345/204 |
| 2010/0226473 | A1* | 9/2010 | Liu | G11C 19/28 377/79 |
| 2011/0255653 | A1* | 10/2011 | Chae | G09G 3/3677 377/79 |
| 2012/0256817 | A1* | 10/2012 | Chen | G11C 19/28 345/92 |
| 2012/0269316 | A1* | 10/2012 | Jang | G09G 3/3677 377/75 |
| 2014/0085285 | A1* | 3/2014 | Kim | G09G 3/3266 345/211 |
| 2015/0002504 | A1* | 1/2015 | Jo | G09G 3/3677 345/213 |
| 2016/0042684 | A1 | 2/2016 | Kim et al. | |
| 2017/0270892 | A1* | 9/2017 | Wang | G09G 5/003 |
| 2018/0182337 | A1 | 7/2018 | Lv et al. | |
| 2018/0210249 | A1 | 7/2018 | Ma et al. | |
| 2019/0206504 | A1 | 7/2019 | Tao et al. | |

FOREIGN PATENT DOCUMENTS

| | | |
|---|---|---|
| CN | 102867543 A | 1/2013 |
| CN | 105374310 A | 3/2016 |
| CN | 106125432 A | 11/2016 |
| CN | 106297719 A | 1/2017 |
| CN | 106531053 A | 3/2017 |
| CN | 107958649 A | 4/2018 |

\* cited by examiner

SHIFT REGISTER, METHOD FOR FABRICATING INVERTER, GATE DRIVING CIRCUIT, AND DISPLAY DEVICE

CROSS-REFERENCE TO RELATED APPLICATION

This application claims priority of Chinese Patent Application No. 201810540401.4, filed on May 30, 2018, which is hereby incorporated by reference in its entirety.

FIELD

The present disclosure relates to the field of display technologies, and particularly to a shift register, a method for fabricating an inverter, a gate driving circuit, and a display device.

BACKGROUND

At present, as the display technologies are advancing rapidly, the cost of a display panel is required to be lower and lower, so the competitiveness of a panel developer depends upon how to lower the fabrication cost of the panel in effect. In order to lower the fabrication cost of the display panel, those skilled in the art may design a gate driving circuit to be arranged at the edge of the display panel, where the gate driving circuit includes a plurality of shift registers, and each row of shift registers control a corresponding row of pixels to display in a display stage. This design can save such an area at the edge of the display panel that a Chip On Film (COF) and a Printed Circuit Board (PCB) are arranged in the area, enable the display panel to be designed with a narrow bezel, and lower the fabrication cost of the display panel, thus improving the competitiveness of the product.

SUMMARY

Accordingly an embodiment of the disclosure provides a shift register including:

a first pulling-down circuit connected respectively with a power source terminal, a first signal terminal, a pull-up node, a first pull-down node, a first output signal terminal, and a second output signal terminal, and configured to write a first level of the power source terminal into the first pull-down node under a control of the first level of the power source terminal, and to write a signal of the first signal terminal respectively into the pull-up node, the first output signal terminal, and the second output signal terminal under a control of the first pull-down node; and to avoid a second level of the power source terminal from being written into the first pull-down node, under a control of a second level of the power source terminal to stop the signal of the first signal terminal from being writing into the pull-up node, the first output signal terminal, and the second output signal terminal; and the first level and the second level of the power source terminal are output alternately, thus resulting in a square wave;

a second pulling down circuit connected respectively with the first signal terminal, the pull-up node, the first node, a second pull-down node, the first output signal terminal, and the second output signal terminal; and a first inverter connected respectively with the power source terminal, the first signal terminal, a second signal terminal, and the first node, and configured to provide the first node with the signal of the first signal terminal under the control of the first level of the power source terminal, and to avoid the first signal terminal from being written into the second pull-down node under the control of the first node to stop writing the signal of the first signal terminal into the pull-up node, the first output signal terminal, and the second output signal terminal under the control of the second pull-down node; and to write a signal of the second signal terminal into the first node under the control of the second level of the power source terminal, and to write the signal of the first signal terminal respectively into the pull-up node, the first output signal terminal, and the second output signal terminal under the control of the first node.

In a possible implementation, in the shift register above according to the embodiment of the disclosure, the first inverter includes: a first switch transistor and a second switch transistor, wherein:

the first switch transistor has a gate connected with the power source terminal, a first electrode connected with the first signal terminal, and a second electrode connected with the first node; and the second switch transistor has a gate connected with the power source terminal, a first electrode connected with the second signal terminal, and a second electrode connected with the first node.

In a possible implementation, in the shift register above according to the embodiment of the disclosure, the first pulling-down circuit includes: a third switch transistor, a fourth switch transistor, a fifth switch transistor, a sixth switch transistor, and a seventh switch transistor:

wherein the third switch transistor has a gate connected with the first pull-down node, a first electrode connected with the power source terminal, and a second electrode connected with the first pull-down node;

the fourth switch transistor has a gate connected with the power source terminal, a first electrode connected with the power source terminal, and a second electrode connected with the first pull-down node;

the fifth switch transistor has a gate connected with the first pull-down node, a first electrode connected with the first signal terminal, and a second electrode connected with the pull-up node;

the sixth switch transistor has a gate connected with the first pull-down node, a first electrode connected with the first signal terminal, and a second electrode connected with the first output signal terminal; and the seventh switch transistor has a gate connected with the first pull-down node, a first electrode connected with the first signal terminal, and a second electrode connected with the second output signal terminal.

In a possible implementation, in the shift register above according to the embodiment of the disclosure, the second pull-down circuit includes: an eighth switch transistor, a ninth switch transistor, a tenth switch transistor, an eleventh switch transistor, and a twelfth switch transistor, wherein:

the eighth switch transistor has a gate connected with the second pull-down node, a first electrode connected with the first node, and a second electrode connected with the second pull-down node;

the ninth switch transistor has a gate connected with the first node, a first electrode connected with the first node, and a second electrode connected with the second pull-down node;

the tenth switch transistor has a gate connected with the second pull-down node, the first electrode connected with the first signal terminal, and the second electrode connected with the pull-up electrode;

the eleventh switch transistor has a gate connected with the second pull-down node, a first electrode connected with the first signal terminal, and a second electrode connected with the first output signal terminal; and the twelfth switch transistor has a gate connected with the second pull-down node, a first electrode connected with the first signal terminal, and a second electrode connected with the second output signal terminal.

In a possible implementation, in the shift register above according to the embodiment of the disclosure, the shift register further includes: an input circuit input circuit connected respectively with an input signal terminal, the second signal terminal, and the pull-up node, and configured to write the signal of the second signal terminal into the pull-up node under the control of the input signal terminal.

In a possible implementation, in the shift register above according to the embodiment of the disclosure, the input circuit includes: a thirteenth switch transistor, wherein:

the thirteenth switch transistor has a gate connected with the input signal terminal Input, a first electrode connected with the second signal terminal, and a second electrode connected with the pull-up node.

In a possible implementation, in the shift register above according to the embodiment of the disclosure, the shift register further includes: a reset circuit connected respectively with a reset signal terminal, the first signal terminal, and the pull-up node, and configured to write the signal of the first signal terminal into the pull-up node under the control of the reset signal terminal.

In a possible implementation, in the shift register above according to the embodiment of the disclosure, the reset circuit includes: a fourteenth switch transistor, wherein the fourteenth switch transistor has a gate connected with the reset signal terminal, a first electrode connected with the first signal terminal, and a second electrode connected with the pull-up node.

In a possible implementation, in the shift register above according to the embodiment of the disclosure, the shift register further includes a restart circuit connected respectively with a restart signal terminal, the first signal terminal, and the pull-up node, and configured to write the signal of the first signal terminal into the pull-up node under the control of the restart signal terminal.

In a possible implementation, in the shift register above according to the embodiment of the disclosure, the restart circuit includes a fifteenth switch transistor, wherein the fifteenth switch transistor has a gate connected with the restart signal terminal, a first electrode connected with the first signal terminal, and a second electrode connected with the pull-up node.

In a possible implementation, in the shift register above according to the embodiment of the disclosure, the shift register further includes: a pull-down node control circuit respectively with the pull-up node, the first signal terminal, the first pull-down node, and the second pull-down node, and configured to write the signal of the first signal terminal respectively into the first pull-down node and the second pull-down node under the control of the pull-up node.

In a possible implementation, in the shift register above according to the embodiment of the disclosure, the pull-down node control circuit includes: a sixteenth switch transistor, a seventh switch transistor, an eighteenth switch transistor, and a nineteenth switch transistor, wherein:

the sixteenth switch transistor has a gate connected with the pull-up node, a first electrode connected with the first signal terminal, and a second electrode connected with the first pull-down node;

the seventeenth switch transistor has a gate connected with the pull-up node, a first electrode connected with the first signal terminal, and a second electrode connected with the first pull-down node;

the eighteenth switch transistor has a gate connected with the pull-up node, a first electrode connected with the first signal terminal, and a second electrode connected with the second pull-down node; and the nineteenth switch transistor has a gate connected with the pull-up node, a first electrode connected with the first signal terminal, and a second electrode connected with the second pull-down node.

In a possible implementation, in the shift register above according to the embodiment of the disclosure, the shift register further includes: an output circuit respectively with the pull-up node, the first output signal terminal, the second output signal terminal, and a clock signal terminal, and configured to provide the first output signal terminal and the second output signal terminal respectively with a signal of the clock signal terminal under the control of the pull-up node.

In a possible implementation, in the shift register above according to the embodiment of the disclosure, the output circuit includes: a twentieth switch transistor, a twenty-first switch transistor, and a capacitor, wherein:

the twentieth switch transistor has a gate connected with the pull-up node, a first electrode connected with the clock signal terminal, and a second electrode connected with the first output signal terminal;

the twenty-first switch transistor has a gate connected with the pull-up node, a first electrode connected with the clock signal terminal, and a second electrode connected with the second output signal terminal; and the capacitor has one terminal connected with the pull-up node, and the other node connected with the first output signal terminal.

In a possible implementation, in the shift register above according to the embodiment of the disclosure, the first switch transistor is a P-type transistor, and the second switch transistor is an N-type transistor; or the first switch transistor is an N-type transistor, and the second switch transistor is a P-type transistor.

Based upon the same inventive idea, an embodiment of the disclosure further provides a gate driving circuit including: a plurality of concentrated shift registers according to any one of the embodiments above of the disclosure, wherein:

an input signal terminal of a first level of shift register is connected with a frame trigger signal terminal;

an input signal terminal of each of other shift registers than the first level of shift register is connected respectively with a second output signal terminal of a preceding level of shift register adjacent to the each of other shift registers; and the first output signal terminal of the each of levels of shift registers is connected with gate lines of its corresponding row.

In a possible implementation, in the gate driving circuit above according to the embodiment of the disclosure, the gate driving circuit further includes: a second inverter, a third inverter, a fourth inverter, a fifth inverter, and a sixth inverter, wherein:

the levels of shift registers are grouped sequentially into a plurality of groups of shift registers so that each group of shift registers includes ten shift registers, wherein the phase of a first clock signal input to the first level of shift register in each group of shift registers is opposite to the phase of a sixth clock signal input to the sixth level of shift register, the phase of a second clock signal input to the second level of shift register is opposite to the phase of a seventh clock signal input to the seventh level of shift register, the phase of a third clock signal input to the third level of shift register is opposite to the phase of a eighth clock signal input to the eighth level of shift register, the phase of a fourth clock signal input to the fourth level of shift register is opposite to the phase of a ninth clock signal input to the ninth level of shift register, and the phase of a fifth clock signal input to the fifth level of shift register is opposite to the phase of a tenth clock signal input to the tenth level of shift register;

the second inverter is connected with a first clock signal terminal for outputting the first clock signal, the first signal terminal, the second signal terminal, and the sixth level of shift register, and configured to provide the sixth level of shift register with the signal of the first signal terminal under the control of a first level of the first clock signal terminal, and to provide the sixth level of shift register with the signal of the second signal terminal under the control of a second level of the first clock signal terminal, wherein the signal of the first signal terminal, and the signal of the second signal terminal constitute the sixth clock signal; and the first level and the second level of the first clock signal terminal are output alternately, thus resulting in a square wave;

the third inverter is connected with a second clock signal terminal for outputting the second clock signal, the first signal terminal, the second signal terminal, and the seventh level of shift register, and configured to provide the seventh level of shift register with the signal of the first signal terminal under the control of a first level of the second clock signal terminal, and to provide the seventh level of the shift register with the signal of the second signal terminal under the control of a second level of the second clock signal terminal, wherein the signal of the first signal terminal, and the signal of the second signal terminal constitute the seventh clock signal; and the first level and the second level of the second clock signal terminal are output alternately, thus resulting in a square wave;

the fourth inverter is connected with a third clock signal terminal for outputting the third clock signal, the first signal terminal, the second signal terminal, and the eighth level of shift register, and configured to provide the eighth level of shift register with the signal of the first signal terminal under the control of a first level of the third clock signal terminal, and to provide the eighth level of shift register with the signal of the second signal terminal under the control of a second level of the third clock signal terminal, wherein the signal of the first signal terminal, and the signal of the second signal terminal constitute an eighth clock signal; and the first level and the second level of the third clock signal terminal are output alternately, thus resulting in a square wave;

the fifth inverter is connected with a fourth clock signal terminal for outputting the fourth clock signal, the first signal terminal, the second signal terminal, and the ninth level of shift register, and configured to provide the ninth level of shift register with the signal of the first signal terminal under the control of a first level of the fourth clock signal terminal, and to provide the ninth level of shift register with the signal of the second signal terminal under the control of a second level of the fourth clock signal terminal, wherein the signal of the first signal terminal, and the signal of the second signal terminal constitute the ninth clock signal; and the first level and the second level of the fourth clock signal terminal are output alternately, thus resulting in a square wave; and the sixth inverter is connected with a fifth clock signal terminal for outputting the fifth clock signal, the first signal terminal, the second signal terminal, and the tenth level of shift register, and configured to provide the tenth level of shift register with the signal of the first signal terminal under the control of a first level of the fifth clock signal terminal, and to provide the tenth level of shift register with the signal of the second signal terminal under the control of a second level of the fifth clock signal terminal, wherein the signal of the first signal terminal, and the signal of the second signal terminal constitute a tenth clock signal; and the first level and the second level of the fourth clock signal terminal are output alternately, thus resulting in a square wave.

In a possible implementation, in the gate driving circuit above according to the embodiment of the disclosure, each of the second inverter, the third inverter, the fourth inverter, the fifth inverter, and the sixth inverter includes: two switch transistors, wherein:

one of the switch transistors has a gate connected with a corresponding clock signal terminal, a first electrode connected with the first signal terminal, and a second electrode connected with a corresponding shift register; and the other switch transistor has a gate connected with a corresponding clock signal terminal, a first electrode connected with the second signal terminal, and a second electrode connected with a corresponding shift register.

Based upon the same inventive idea, an embodiment of the disclosure further provides a display device including the gate driving circuit according to any one of the embodiments above of the disclosure.

Correspondingly an embodiment of the disclosure further provides a method for fabricating any one of the first inverter, the second inverter, the third inverter, the fourth inverter, the fifth inverter, and the sixth inverter in the gate driving circuit according to the embodiment above of the disclosure, the method including the steps of:

preparing a base substrate; and forming a light-shielding layer, a buffer layer, a semiconductor layer, a gate insulation layer, a gate layer, an interlayer medium layer, and a source-drain layer on the underlying substrate in that order.

DETAILED DESCRIPTION OF THE EMBODIMENTS

Particular implementations of the shift register, the method for fabricating an inverter, the gate driving circuit, and the display device according to the embodiments of the disclosure will be described below in details with reference to the drawings. It shall be noted that the embodiments described in the specification are only a part but not all of the embodiments of the disclosure, and the embodiments of the disclosure, and the features in the embodiments can be combined with each other unless they conflict with each other; and moreover all the other embodiments which can occur to those ordinarily skilled in the art based upon the embodiments here of the disclosure without any inventive effort shall fall into the claimed scope of the disclosure.

Figure 1:
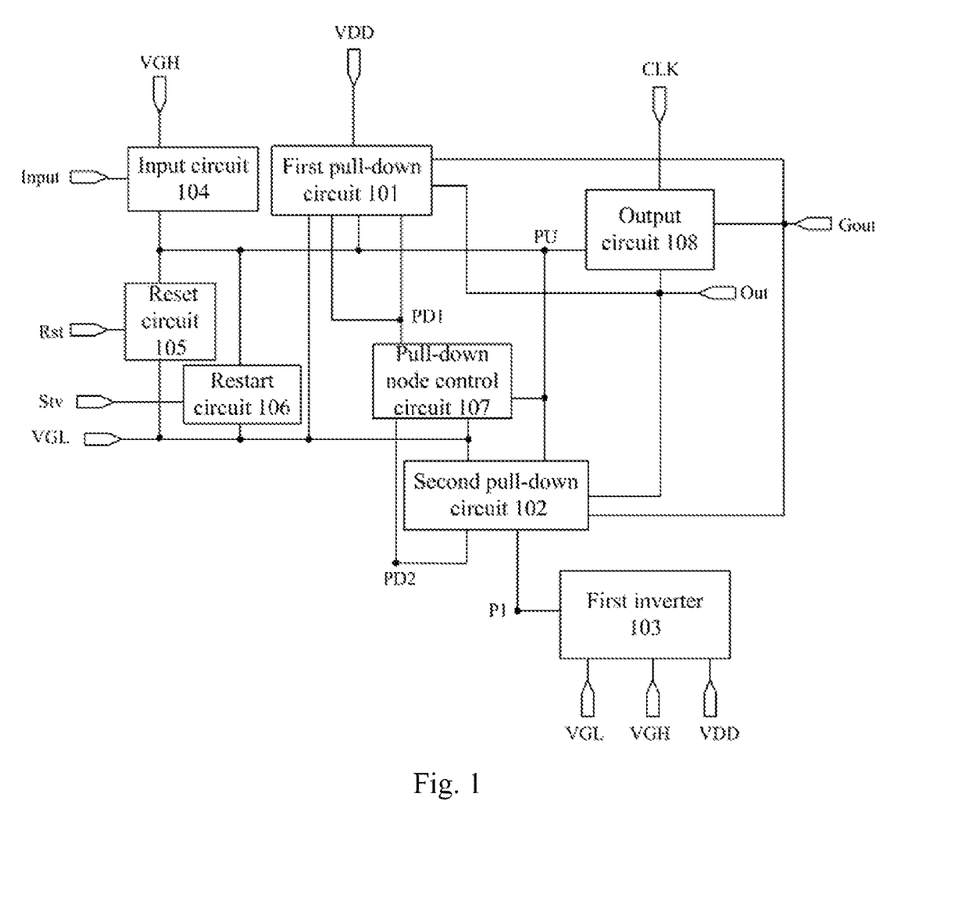
FIG. 1 is a schematic structural diagram of a shift register according to an embodiment of the disclosure.

As illustrated in FIG. 1, a shift register according to an embodiment of the disclosure includes a first pulling-down circuit 101, a second pulling-down circuit 102, and a first inverter 103, where the first pulling-down circuit 101 is connected respectively with a power source terminal VDD, a first signal terminal VGL, a pull-up node PU, a first pull-down node PD1, a first output signal terminal Gout, and a second output signal terminal Out, and configured to write a first level of the power source terminal VDD into the first pull-down node PD1 under the control of the first level of the power source terminal VDD, and to write a signal of the first signal terminal VGL respectively into the pull-up node PU, the first output signal terminal Gout, and the second output signal terminal Out under the control of the first pull-down node PD1; and to avoid a second level of the power source terminal VDD from being written into the first pull-down node PD1, under the control of the second level of the power source terminal VDD to stop the signal of the first signal terminal VGL from being writing into the pull-up node PU, the first output signal terminal Gout, and the second output signal terminal Out; and the first level and the second level of the power source terminal VDD are output alternately, thus resulting in a square wave.

The first inverter 103 is connected respectively with the power source terminal VDD, the first signal terminal VGL, a second signal terminal VGH, and the first node P1, and the second pull-down circuit 102 is connected respectively with the first signal terminal VGL, the pull-up node PU, the first node P1, a second pull-down node PD2, the first output signal terminal Gout, and the second output signal terminal Out; and the first inverter 103 is configured to provide the first node P1 with the signal of the first signal terminal VGL under the control of the first level of the power source terminal VDD, and to disconnect the first signal terminal VGL from the second pull-down node PD2 under the control of the first node P1 to stop the signal of the first signal terminal VGL from being written into the pull-up node PU, the first output signal terminal Gout, and the second output signal terminal Out; and to write a signal of the second signal terminal VGH into the first node P1 under the control of the second level of the power source terminal VDD, and to write the signal of the first signal terminal VGL respectively into the pull-up node PU, the first output signal terminal Gout, and the second output signal terminal Out under the control of the first node P1.

In the shift register above according to the embodiment of the disclosure, the first inverter 103 is additionally arranged in the shift register so that the first pulling-down circuit 101 and the second pulling-down circuit 102 can be controlled using only one power source terminal VDD to operate alternately, so the number of pins on a chip on film and a printed circuit board can be reduced in the embodiment of the disclosure as compared with the technical solution in the related art where the two pulling-down circuits are controlled using two power source terminals VDD to operate alternately.

It shall be noted that the level of the power source terminal VDD as referred to in the embodiment of the disclosure refers to a level corresponding to the square wave provided by the power source terminal VDD. Optionally, the first level of the power source terminal VDD refers to a high level of the square wave, and correspondingly the second level of the power source terminal VDD refers to a low level of the square wave; or the first level of the power source terminal VDD refers to a low level of the square wave, and the second level of the power source terminal VDD refers to a high level of the square wave.

Figure 2:
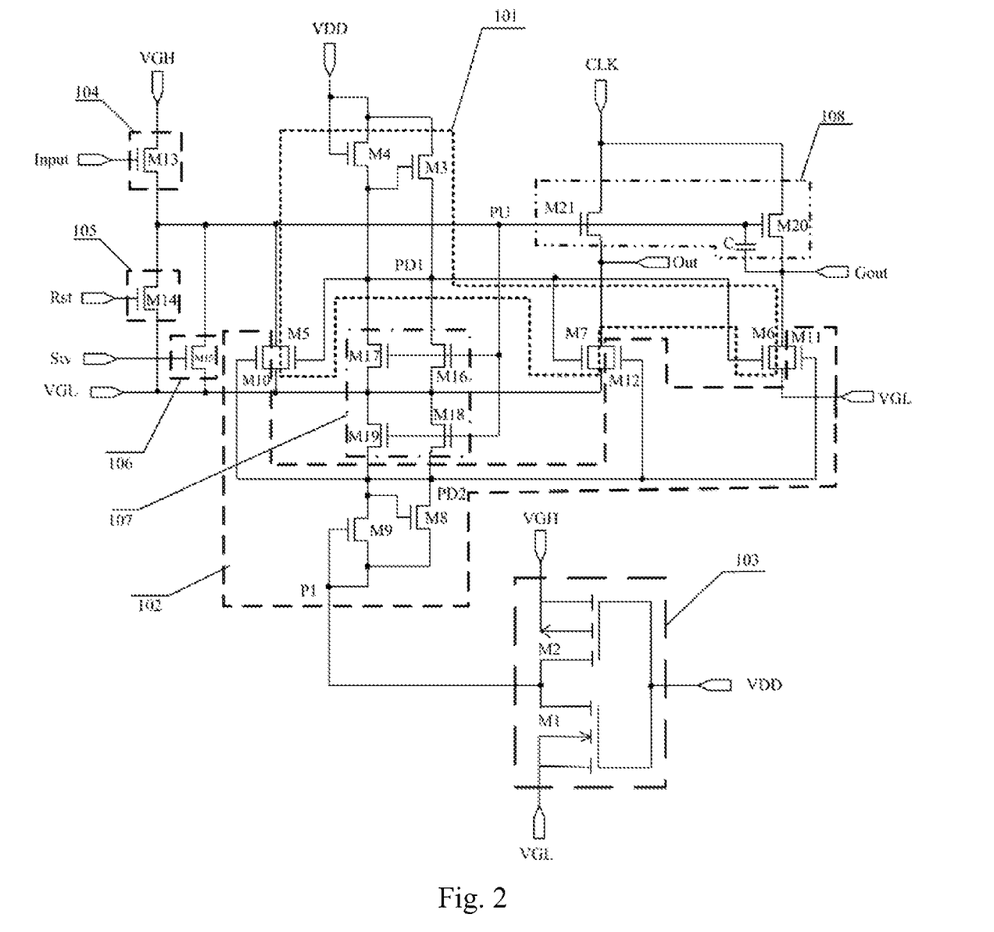
FIG. 2 is a schematic structural diagram in details of the shift register as illustrated in FIG. 1.

In the shift register as illustrated in FIG. 2, respective switch transistors in the first pulling-down circuit 101 and the second pulling-down circuit 102 are N-type transistors which are switched on at a high level, and switched off at a low level, so the first level of the power source terminal VDD refers to a high level, and the second level thereof refers to a low level. As can be appreciated, in the shift register as illustrated in FIG. 1, the respective switch transistors in the first pulling-down circuit 101 and the second pulling-down circuit 102 can alternatively be P-type transistors which are switched on at a low level, and switched off at a high level, so the first level of the power source terminal VDD refers to a low level, and the second level thereof refers to a high level.

Moreover, in order to perform a shifting function, in the shift register according to the embodiment of the disclosure, as illustrated in FIG. 1, the shift register further includes: an input circuit 104, a reset circuit 105, a restart circuit 106, a pull-down node control circuit 107, and an output circuit 108.

The input circuit 104 is connected respectively with the input signal terminal Input, the second signal terminal VGH, and the pull-up node PU, and configured to write the signal of the second signal terminal VGH into the pull-up node PU under the control of the input signal terminal Input.

The reset circuit 105 is connected respectively with a reset signal terminal Rst, the first signal terminal VGL, and the pull-up node PU, and configured to write the signal of the first signal terminal VGL into the pull-up node PU under the control of the reset signal terminal Rst.

The restart circuit 106 is connected respectively with a restart signal terminal Sty, the first signal terminal VGL, and the pull-up node PU, and configured to write the signal of the first signal terminal VGL into the pull-up node PU under the control of the restart signal terminal Sty.

The pull-down node control circuit 107 is connected respectively with the pull-up node PU, the first signal terminal VGL, the first pull-down node PD1, and the second pull-down node PD2, and configured to write the signal of the first signal terminal VGL respectively into the first pull-down node PD1 and the second pull-down node PD2 under the control of the pull-up node PU.

The output circuit 108 is connected respectively with the pull-up node PU, the first output signal terminal Gout, the second output signal terminal Out, and a clock signal terminal CLK, and configured to provide the first output signal terminal and the second output signal terminal Out respectively with a signal of the clock signal terminal CLK under the control of the pull-up node PU.

The shift register according to the embodiment of the disclosure will be described below in details in connection with a particular embodiment thereof, and this particular embodiment is intended to better explain the disclosure, but not to limit the disclosure thereto.

As illustrated in FIG. 2, in the shift register according to the embodiment of the disclosure, the first inverter 103 includes: a first switch transistor M1 and a second switch transistor M2, where the first switch transistor M1 has a gate connected with the power source terminal VDD, a first electrode connected with the first signal terminal VGL, and a second electrode connected with the second pull-down circuit 102; and the second switch transistor M2 has a gate connected with the power source terminal VDD, a first electrode connected with the second signal terminal VGH, and a second electrode connected with the second pull-down circuit 102.

It shall be noted that when the first level of the power source terminal VDD is a high level, and the second level thereof is a low level, the first switch transistor M1 is an N-type transistor, and the second switch transistor M2 is a P-type transistor; and when the first level of the power source terminal VDD is a low level, and the second level thereof is a high level, the first switch transistor M1 is a P-type transistor, and the second switch transistor M2 is an N-type transistor.

The first pulling-down circuit 101 includes a third switch transistor M3, a fourth switch transistor M4, a fifth switch transistor M5, a sixth switch transistor M6, and a seventh switch transistor M7, where the third switch transistor M3 has a gate connected with the first pull-down node PD1, a first electrode connected with the power source terminal VDD, and a second electrode connected with the first pull-down node PD1; the fourth switch transistor M4 has a gate connected with the power source terminal VDD, a first electrode connected with the power source terminal VDD, and a second electrode connected with the first pull-down node PD1; the fifth switch transistor M5 has a gate connected with the first pull-down node PD1, a first electrode connected with the first signal terminal VGL, and a second electrode connected with the pull-up node PU; the sixth switch transistor M6 has a gate connected with the first pull-down node PD1, a first electrode connected with the first signal terminal VGL, and a second electrode connected with the first output signal terminal Gout; and the seventh switch transistor M7 has a gate connected with the first pull-down node PD1, a first electrode connected with the first signal terminal VGL, and a second electrode connected with the second output signal terminal Out.

The second pull-down circuit 102 includes an eighth switch transistor M8, a ninth switch transistor M9, a tenth switch transistor M10, an eleventh switch transistor M11, and a twelfth switch transistor M12, where the eighth switch transistor M8 has a gate connected with the second pull-down node PD2, a first electrode connected with the first node P1, and a second electrode connected with the second pull-down node PD2; the ninth switch transistor M9 has a gate connected with the first node P1, a first electrode connected with the first node P1, and a second electrode connected with the second pull-down node PD2; the tenth switch transistor M10 has a gate connected with the second pull-down node PD2, the first electrode connected with the first signal terminal VGL, and the second electrode connected with the pull-up electrode PU; the eleventh switch transistor M11 has a gate connected with the second pull-down node PD2, a first electrode connected with the first signal terminal VGL, and a second electrode connected with the first output signal terminal Gout; and the twelfth switch transistor M12 has a gate connected with the second pull-down node PD2, a first electrode connected with the first signal terminal VGL, and a second electrode connected with the second output signal terminal Out.

The input circuit 104 includes a thirteenth switch transistor M13, where the thirteenth switch transistor M13 has a gate connected with the input signal terminal Input, a first electrode connected with the second signal terminal VGH, and a second electrode connected with the pull-up node PU.

The reset circuit 105 includes a fourteenth switch transistor M14, where the fourteenth switch transistor M14 has a gate connected with the reset signal terminal Rst, a first electrode connected with the first signal terminal VGL, and a second electrode connected with the pull-up node PU.

The restart circuit 106 includes a fifteenth switch transistor M15, where the fifteenth switch transistor M15 has a gate connected with the restart signal terminal Sty, a first electrode connected with the first signal terminal VGL, and a second electrode connected with the pull-up node PU.

The pull-down node control circuit 107 includes a sixteenth switch transistor M16, a seventh switch transistor M17, an eighteenth switch transistor M18, and a nineteenth switch transistor M19, where the sixteenth switch transistor M16 has a gate connected with the pull-up node PU, a first electrode connected with the first signal terminal VGL, and a second electrode connected with the first pull-down node PD1; the seventeenth switch transistor M17 has a gate connected with the pull-up node PU, a first electrode connected with the first signal terminal VGL, and a second electrode connected with the first pull-down node PD1; the eighteenth switch transistor M18 has a gate connected with the pull-up node PU, a first electrode connected with the first signal terminal VGL, and a second electrode connected with the second pull-down node PD2; and the nineteenth switch transistor M19 has a gate connected with the pull-up node PU, a first electrode connected with the first signal terminal VGL, and a second electrode connected with the second pull-down node PD2.

The output circuit 108 includes a twentieth switch transistor M20, a twenty-first switch transistor M21, and a capacitor C, where the twentieth switch transistor M20 has a gate connected with the pull-up node PU, a first electrode connected with the clock signal terminal CLK, and a second electrode connected with the first output signal terminal Gout; the capacitor C is connected between the pull-up node PU and the first output signal terminal Gout; and the twenty-first switch transistor M21 has a gate connected with the pull-up node PU, a first electrode connected with the clock signal terminal CLK, and a second electrode connected with the second output signal terminal Out.

The particular structures of the respective circuits in the shift register according to the embodiment of the disclosure have only been described above by way of an example, and in a particular implementation, the particular structures of the respective circuits will not be limited to the structures above according to the embodiment of the disclosure, but can alternatively be other structures which can occur to those skilled in the art, and the embodiment of the disclosure will not be limited thereto.

Moreover in an optional implementation, the first electrodes and the second electrodes of these switch transistors are sources and drains respectively, and can be interchanged in function dependent upon their different switch transistor types and input signals, so they will not be distinguished from each other here. Furthermore the switch transistors above can be Thin Film Transistors (TFTs), or Metal Oxide Semiconductor Field-Effect Transistors (MOSFETs), although the embodiment of the disclosure will not be limited thereto.

In order to make the technical solutions according to the embodiment of the disclosure more apparent, a particular operating process of the shift register as illustrated in FIG. 2 will be introduced below in details.

Figure 3:
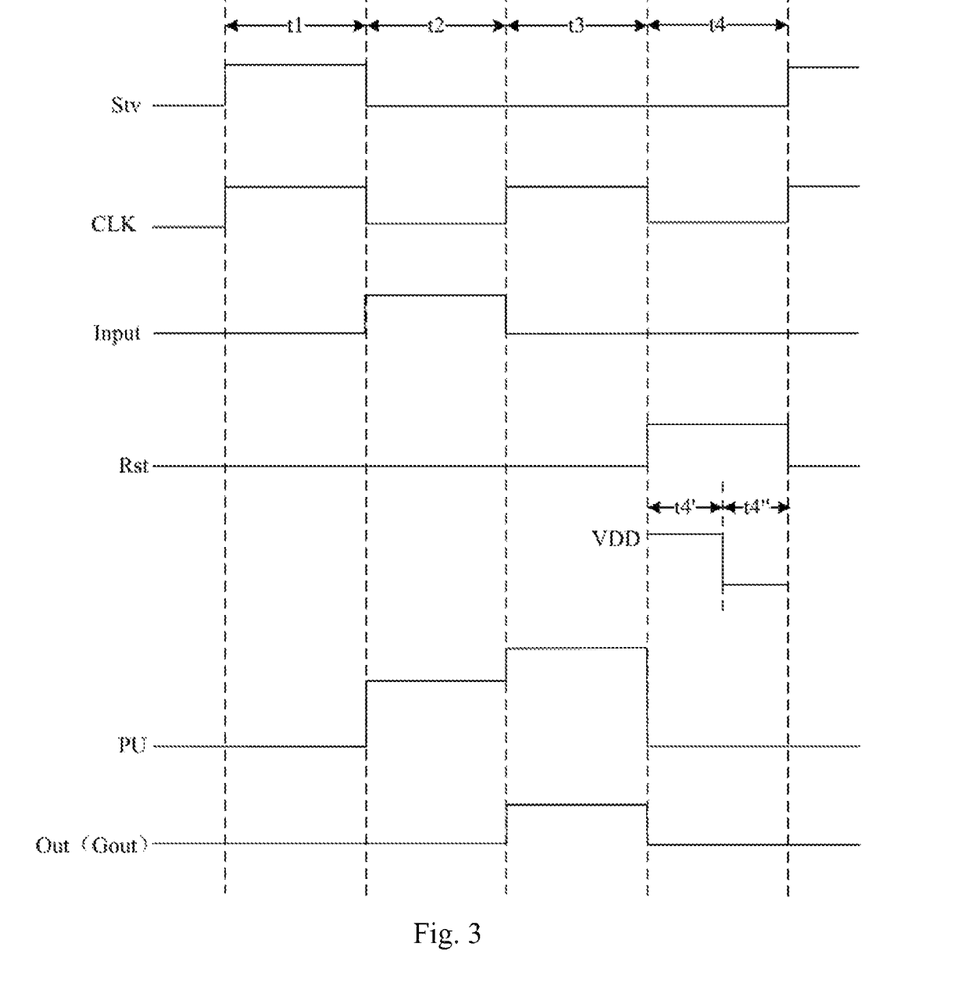
FIG. 3 is an operating timing diagram of the shift register as illustrated in FIG. 2.

In the shift register as illustrated in FIG. 2, the second switch transistor M2 is a P-type transistor, which is switched on at a low level, and switched off at a high level; and all the other switch transistors are N-type transistors, where the respective N-type transistors are switched on at a high level, and switched off at a low level; and furthermore the first signal terminal VGL outputs a low level, and the second signal terminal VGH outputs a high level, as illustrated in FIG. 3. FIG. 3 illustrates a corresponding operating timing diagram thereof, and particularly a restart stage t1, an input stage t2, an output stage t3, and a pull-down stage t4 in the operating timing diagram as illustrated in FIG. 3 will be described in details by way of an example.

In the restart stage t1, the restart signal terminal Sty outputs a high level, the input signal terminal Input outputs a low level, the reset signal terminal Rst outputs a low level, the power source terminal VDD has no output, and the clock signal terminal CLK outputs a high level.

The fifteenth switch transistor M15 is switched on due to the high level of the restart signal terminal Sty, and all the other switch transistors are switched off. The low level of the first signal terminal VGL is written into the pull-up node PU through the fifteenth switch transistor M15 which is switched on to restart the pull-up node PU.

In the input stage t2, the restart signal terminal Sty outputs a low level, the input signal terminal Input outputs a high level, the reset signal terminal Rst outputs a low level, the power source terminal VDD has no output, and the clock signal terminal CLK outputs a low level.

The thirteenth switch transistor M13 is switched on due to the high level of the input signal terminal Input, and the high level of the second signal terminal VGH is written into the pull-up node PU through the thirteenth switch transistor M13 which is switched on. The twenty switch transistor M20 is switched on due to the high level of the pull-up node PU, and the first output signal terminal Gout outputs the low level of the clock signal terminal CLK. The twenty-first switch transistor M21 is switched on due to the high level of the pull-up node PU, and the second output signal terminal Out outputs the low level of the clock signal terminal CLK. The sixteenth switch transistor M16 and the seventeenth switch transistor M17 are switched on due to the high level of the pull-up node PU so that the low level of the first signal terminal VGL is written into the first pull-down node PD1, and the fifth switch transistor M5, the sixth switch transistor M6, and the seventh switch transistor M7 are switched off due to the low level of the first pull-down PD1. Alike the eighteenth switch transistor M18 and the nineteenth switch transistor M19 are switched on due to the high level of the pull-up node PU so that the low level of the first signal terminal VGL is written into the second pull-down node PD2, and the tenth switch transistor M10, the eleventh switch transistor M11, and the twelfth switch transistor M12 are switched off due to the low level of the second pull-down node PD2.

In the output stage t3, the restart signal terminal Sty outputs a low level, the input signal terminal Input outputs a low level, the reset signal terminal Rst outputs a low level, the power source terminal VDD has no output, and the clock signal terminal CLK outputs a high level.

Since the capacitor C has been charged in the input stage t1, the capacitor C is stopped from being charged in the output stage t2, but the capacitor C is discharged in this stage (output stage t2) so that the level of the pull-up node PU is further raised due to the bootstrapping capacitor C, and the twentieth switch transistor M20 is switched on due to the high level of the pull-up node PU, and the first output signal terminal Gout outputs the high level of the clock signal terminal CLK. The twenty-first switch transistor M21 is switched on due to the high level of the pull-up node PU, and the second output signal terminal Out outputs the high level of the clock signal terminal CLK. The sixteenth switch transistor M16 and the seventh switch transistor M17 are switched on due to the high level of the pull-up node PU so that the low level of the first signal terminal VGL is written into the first pull-down node PD1, and the fifth switch transistor M5, the sixth switch transistor M6, and the seventh switch transistor M7 are switched off due to the low level of the first pull-down PD1. Alike the eighteenth switch transistor M18 and the nineteenth switch transistor M19 are switched on due to the high level of the pull-up node PU so that the low level of the first signal terminal VGL is written into the second pull-down node PD2, and the tenth switch transistor M10, the eleventh switch transistor M11, and the twelfth switch transistor M12 are switched off due to the low level of the second pull-down node PD2.

In the pull-down stage t4, the restart signal terminal Sty outputs a low level, the input signal terminal Input outputs a low level, the reset signal terminal Rst outputs a high level, the power source terminal VDD outputs a high level in a first pull-down stage t4', and a low level in a second pull-down stage t4", and the clock signal terminal CLK outputs a low level.

The fourteenth switch transistor M14 is switched on due to the high level of the reset signal terminal Rst, and the first signal terminal VGL pulls down the level of the pull-up node PU. In the first pull-down stage t4' in which the power source terminal VDD outputs a high level, both the fourth switch transistor M4 and the third switch transistor M3 are switched on so that the high level of the power source terminal VDD is written into the first pull-down node PD1 through the fourth switch transistor M4 and the third switch transistor M3, which are switched on. The fifth switch transistor M5 is switched on under the control of the first pull-down node PD1 so that the low level of the first signal terminal VGL is written into the pull-up node PU to further reset the pull-up node PU. The sixth switch transistor M6 is switched on under the control of the first pull-down node PD1, and the low level of the first signal terminal VGL is written into the first output signal terminal Gout through the sixth switch transistor M6 which is switched on, to pull down the level of the first output signal terminal Gout. The seventh switch transistor M7 is switched on under the control of the first pull-down node PD1, and the low level of the first signal terminal VGL is written into the second output signal terminal Out through the seventh switch transistor M7 which is switched on, to pull down the level of the second output signal terminal Out. The first switch transistor M1 is switched on due to the high level of the power source terminal VDD so that the low-level signal of the first signal terminal VGL is written into the gate of the ninth switch transistor M9 through the first switch transistor M1 which is switched on, so that the ninth switch transistor M9 is switched off, and further all the respective other switch transistors in the second pull-down circuit 102 are switched off.

Furthermore, in the second pull-down stage t4" in which the power source terminal VDD outputs a low level, the second switch transistor M2 is switched on due to the low level of the power source terminal VDD, and provides the ninth switch transistor M9 and the eighth switch transistor M8 with the high level of the second signal terminal VGH, so that both the ninth switch transistor M9 and the eighth switch transistor M8 are switched on due to the high level of the second signal terminal VGH, and the high level of the second signal terminal VGH is written into the second pull-down node PD2 through the ninth switch transistor M9 and the eighth switch transistor M8, which are switched on. The tenth switch transistor M10 is switched on under the control of the second pull-down node PD2 so that the low level of the first signal terminal VGL is written into the pull-up node PU to further reset the pull-up node PU. The eleventh switch transistor M11 is switched on under the control of the second pull-down node PD2, and the low level of the first signal terminal VGL is written into the first output signal terminal Gout through the eleventh switch transistor M11 which is switched on, to pull down the level of the first output signal terminal Gout. The twelfth switch transistor M12 is switched on under the control of the second pull-down node PD2, and the low level of the first signal terminal VGL is written into the second output signal terminal Out through the twelfth switch transistor M12 which is switched on to pull down the level of the first output signal terminal Out. The fourth switch transistor M4 is switched off due to the low level of the power source terminal VDD so that the respective other switch transistors in the first pull-down circuit 101 are switched off.

As can be apparent from the description above, in the shift register according to the embodiment of the disclosure, the first pull-down circuit 101 and the second pull-down circuit 102 can operate alternately through only one power source terminal VDD together with the additionally arranged inverter 103 including the first switch transistor M1 and the second switch transistor M2, so the number of pins in a chip on film and a printed circuit board to provide the shift register with corresponding signals can be reduced in the embodiment of the disclosure as compared with the technical solution in the related art where the first pull-down circuit 101 and the second pull-down circuit 102 are controlled using two power source terminals to operate alternately.

High-definition products and ultra-high-definition products are required to be of a high display quality. A higher display quality can be achieved with a higher charging ratio and higher power consumption, and in order to satisfy the charging ratio and the power consumption, the number of clock signals of the products has been increased so far to greater than ten.

Figure 4:
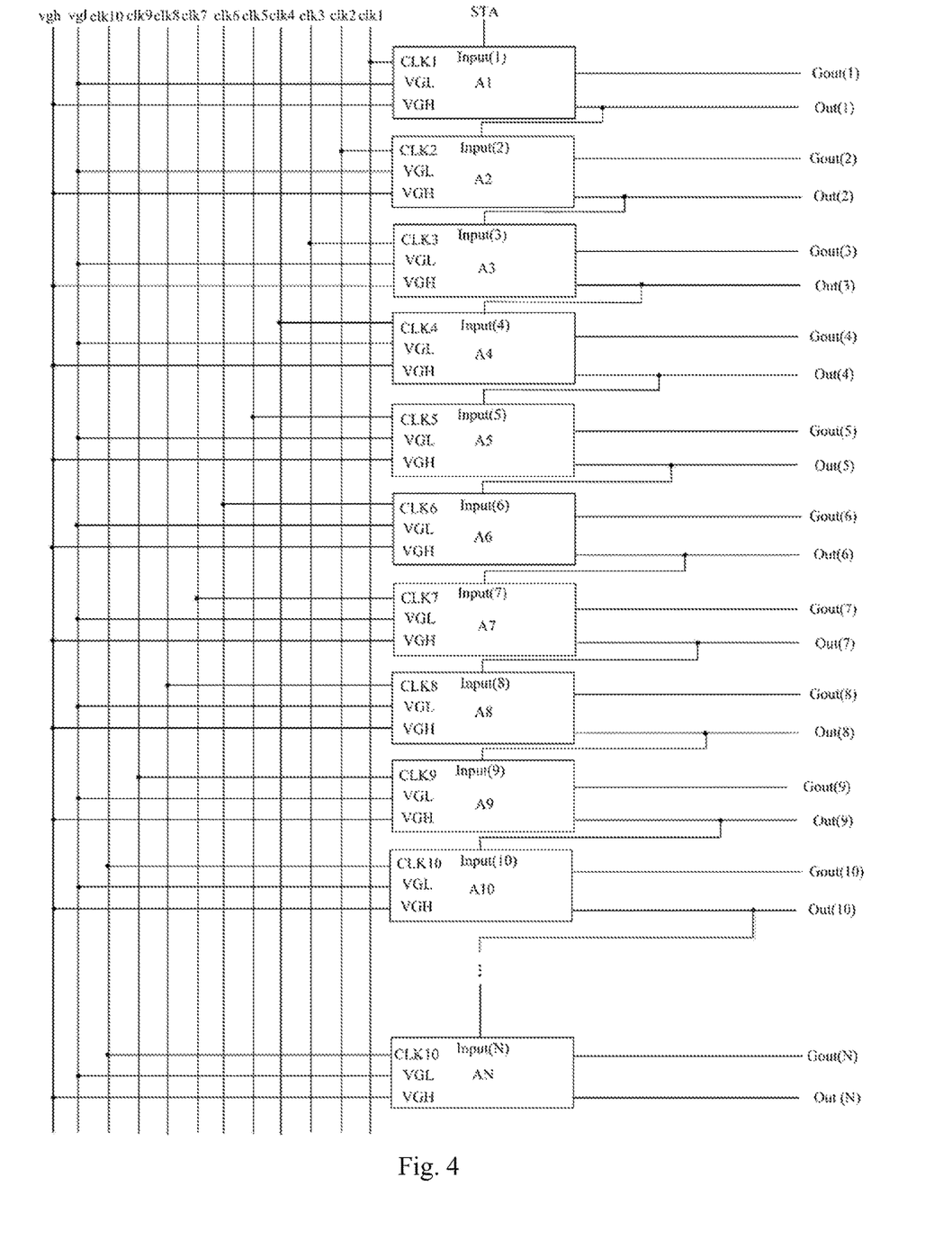
FIG. 4 is a schematic structural diagram of a gate driving circuit in the related art.
Figure 5:
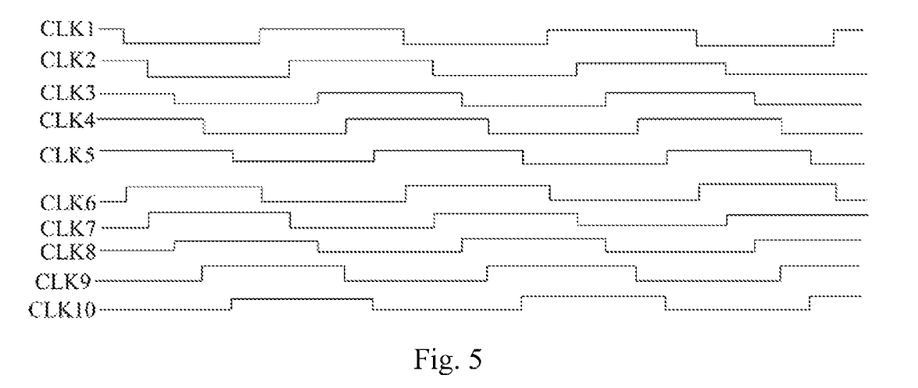
FIG. 5 is a schematic structural diagram of a gate driving circuit according to an embodiment of the disclosure.

In such products, respective shift registers at the first to last levels in a gate driving circuit are grouped sequentially so that each group includes ten shift registers, and as illustrated in FIG. 4 and FIG. 5, the phase of a first clock signal CLK1 input to the first level of shift register A1 in each group of shift registers (e.g., a group of shift register including the first level of shift register A1 to the tenth level of shift register A10) is opposite to the phase of a sixth clock signal CLK6 input to the sixth level of shift register A6, the phase of a second clock signal CLK2 input to the second level of shift register A2 is opposite to the phase of a seventh clock signal CLK7 input to the seventh level of shift register A7, the phase of a third clock signal CLK3 input to the third level of shift register A3 is opposite to the phase of a seventh clock signal CLK8 input to the eighth level of shift register A8, the phase of a fourth clock signal CLK4 input to the fourth level of shift register A4 is opposite to the phase of a ninth clock signal CLK9 input to the ninth level of shift register A9, and the phase of a fifth clock signal CLK5 input to the fifth level of shift register A5 is opposite to the phase of a tenth clock signal CLK10 input to the tenth level of shift register A10.

Figure 6:
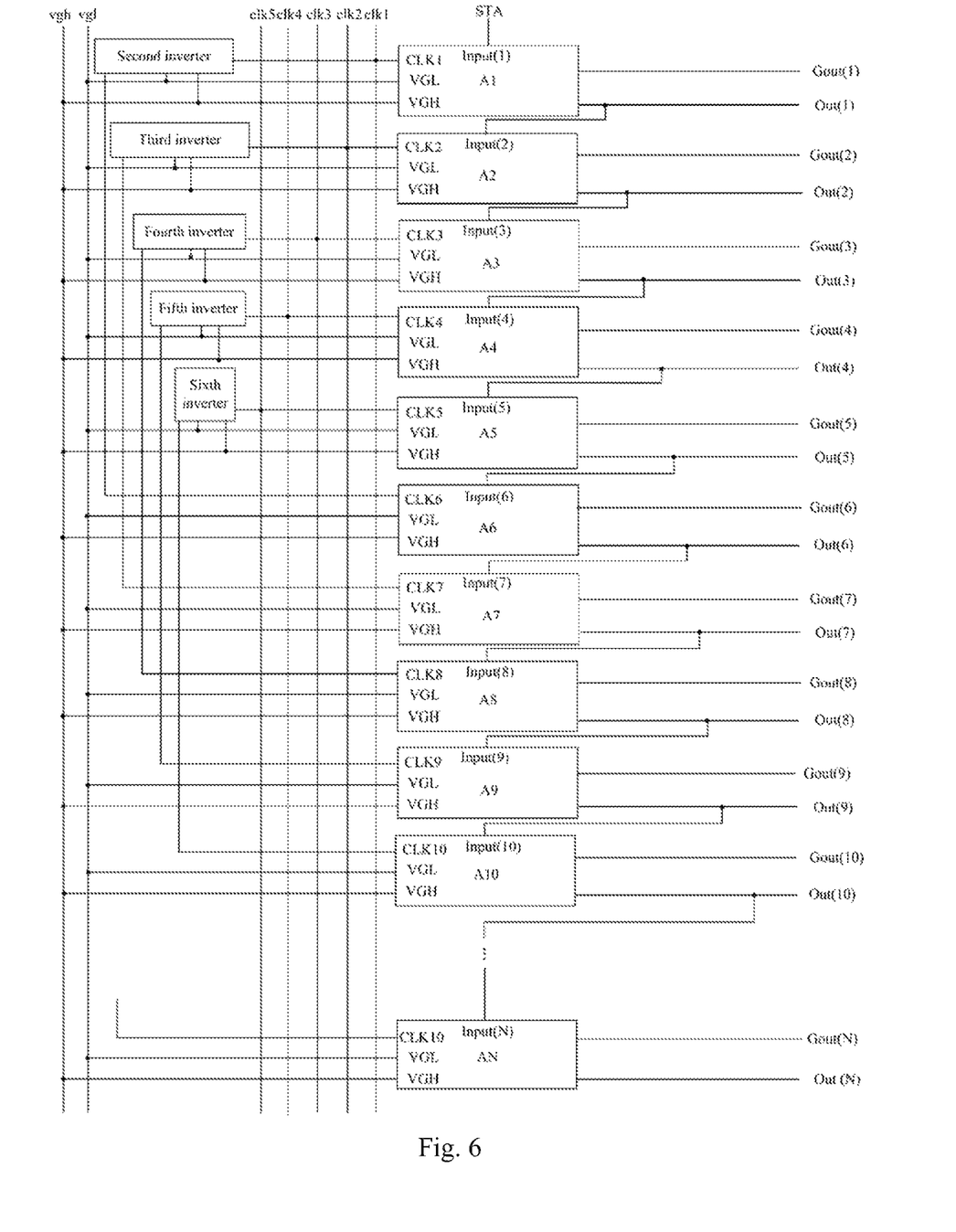
FIG. 6 is a phase diagram of ten clock signals in the gate driving circuit according to the embodiment of the disclosure.

There are also a large number of pins, on a chip on film and a printed circuit board corresponding to the products above with ten clock signals, to output clock signals. In view of this, in order to reduce the number of pins in the chip on film and the printed circuit board to provide the shift registers with clock signals, a second inverter, a third inverter, a fourth inverter, a fifth inverter, and a sixth inverter are additionally arranged in the gate circuit according to the embodiment of the disclosure as illustrated in FIG. 6, where the first signal terminal VGL is connected with a first signal line vgl, the second signal terminal VGH is connected with a second signal line vgh, and the second inverter is connected with a first clock signal terminal clk1 for outputting the first clock signal CLK1, the first signal terminal VGL, the second signal terminal VGH, and the sixth level of shift register A6, and configured to provide the sixth level of shift register A6 with the signal of the first signal terminal VGL under the control of a first level of the first clock signal terminal, and to provide the sixth level of shift register A6 with the signal of the second signal terminal VGH under the control of a second level of the first clock signal terminal, where the signal of the first signal terminal VGL, and the signal of the second signal terminal VGH constitute the sixth clock signal clk6; and the first level and the second level of the first clock signal terminal clk1 are output alternately, thus resulting in a square wave as illustrated in FIG. 5.

The third inverter is connected with a second clock signal terminal clk2 for outputting the second clock signal CLK2, the first signal terminal VGL, the second signal terminal VGH, and the seventh level of shift register A7, and configured to provide the seventh level of shift register A7 with the signal of the first signal terminal VGL under the control of a first level of the second clock signal terminal clk2, and to provide the seventh level of the shift register A7 with the signal of the second signal terminal VGH under the control of a second level of the second clock signal terminal clk2, where the signal of the first signal terminal VGL, and the signal of the second signal terminal VGH constitute the seventh clock signal clk7; and the first level and the second level of the second clock signal terminal clk2 are output alternately, thus resulting in a square wave as illustrated in FIG. 5.

The fourth inverter is connected with a third clock signal terminal clk3 for outputting the third clock signal CLK3, the first signal terminal VGL, the second signal terminal VGH, and the eighth level of shift register A8, and configured to provide the eighth level of shift register A8 with the signal of the first signal terminal VGL under the control of a first level of the third clock signal terminal clk3, and to provide the eighth level of shift register A8 with the signal of the second signal terminal VGH under the control of a second level of the third clock signal terminal clk3, where the signal of the first signal terminal VGL, and the signal of the second signal terminal VGH constitute an eighth clock signal clk8; and the first level and the second level of the third clock signal terminal clk3 are output alternately, thus resulting in a square wave as illustrated in FIG. 5.

The fifth inverter is connected with a fourth clock signal terminal clk4 for outputting the fourth clock signal CLK4, the first signal terminal VGL, the second signal terminal VGH, and the ninth level of shift register A9, and configured to provide the ninth level of shift register A9 with the signal of the first signal terminal VGL under the control of a first level of the fourth clock signal terminal clk4, and to provide the ninth level of shift register A9 with the signal of the second signal terminal VGH under the control of a second level of the fourth clock signal terminal clk4, where the signal of the first signal terminal VGL, and the signal of the second signal terminal VGH constitute the ninth clock signal clk9; and the first level and the second level of the fourth clock signal terminal clk4 are output alternately, thus resulting in a square wave as illustrated in FIG. 5.

The sixth inverter is connected with a fifth clock signal terminal clk5 for outputting the fifth clock signal CLK5, the first signal terminal VGL, the second signal terminal VGH, and the tenth level of shift register A10, and configured to provide the tenth level of shift register A10 with the signal of the first signal terminal VGL under the control of a first level of the fifth clock signal terminal clk5, and to provide the tenth level of shift register A10 with the signal of the second signal terminal VGH under the control of a second level of the fifth clock signal terminal clk5, where the signal of the first signal terminal VGL, and the signal of the second signal terminal VGH constitute the tenth clock signal clk10.

In this way, it is not necessary to input clock signals separately to the sixth level of shift register, the seventh level of shift register, the eighth level of shift register, the ninth level of shift register, and the tenth level of shift register in each group of shift registers, thus halving the number of pins in a chip on film and a printed circuit board to provide the gate driving circuit with clock signals.

It shall be noted that the second inverter, the third inverter, the fourth inverter, the fifth inverter, and the sixth inverter in FIG. 6 are arranged outside the shift register, and in a real application, the respective inverters can alternatively be arranged inside the shift register, although the embodiment of the disclosure will not be limited thereto.

Optionally, in the gate driving circuit according to the embodiment of the disclosure, the second inverter, the third inverter, the fourth inverter, the fifth inverter, and the sixth inverter each include: two switch transistors, where one of the switch transistors has a gate connected with a corresponding clock signal terminal, a first electrode connected with the first signal terminal, and a second electrode connected with a corresponding shift register; and the other switch transistor has a gate connected with a corresponding clock signal terminal, a first electrode connected with the second signal terminal, and a second electrode connected with a corresponding shift register. Furthermore, one of these two switch transistors is a P-type transistor, and the other switch transistor is an N-type transistor.

For example, the second inverter includes two switch transistors, for example, and then one of the switch transistors has a gate connected with the first clock signal terminal, a first electrode connected with the first signal terminal, and a second electrode connected with the sixth level of shift register; and the other switch transistor has a gate connected with the first clock signal terminal, a first electrode connected with the second signal terminal, and a second electrode connected with the sixth level of shift register.

Furthermore, in the case that the first level of the first clock signal terminal clk1 is a high level, and the second level thereof is a low level, the switch transistor with the first electrode connected with the first signal terminal VGL is an N-type transistor, and the switch transistor with the first electrode connected with the second signal terminal VGH is a P-type transistor; and in the case that the first level of the first clock signal terminal clk1 is a low level, and the second level thereof is a high level, the switch transistor with the first electrode connected with the first signal terminal VGL is a P-type transistor, and the switch transistor with the second electrode connected with the second signal terminal VGH is an N-type transistor.

Figure 7:
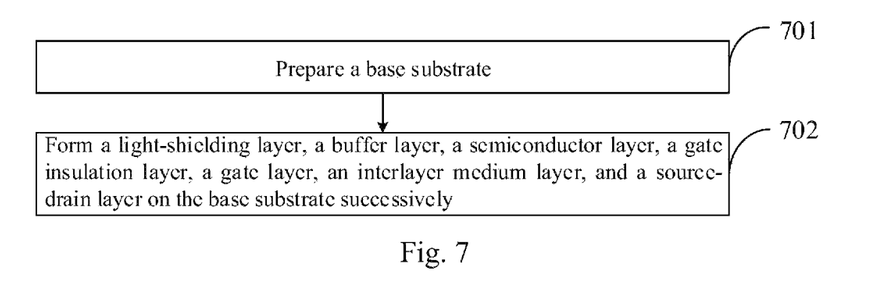
FIG. 7 is a flow chart of a method for fabricating an inverter according to an embodiment of the disclosure.

Moreover as illustrated in FIG. 7, an embodiment of the disclosure further provides a method for fabricating any one of the first inverter, the second inverter, the third inverter, the fourth inverter, the fifth inverter, and the sixth inverter in the gate driving circuit according to the embodiment of the disclosure includes the following steps:

the step S701 is to prepare a base substrate; and the step S702 is to form a light-shielding layer, a buffer layer, a semiconductor layer, a gate insulation layer, a gate layer, an interlayer medium layer, and a source-drain layer on the base substrate successively.

For the sake of convenient understanding, the switch transistors in the first inverter to the sixth inverter are MOS transistors, which are fabricated using the LTPS process, for example.

Figure 8:
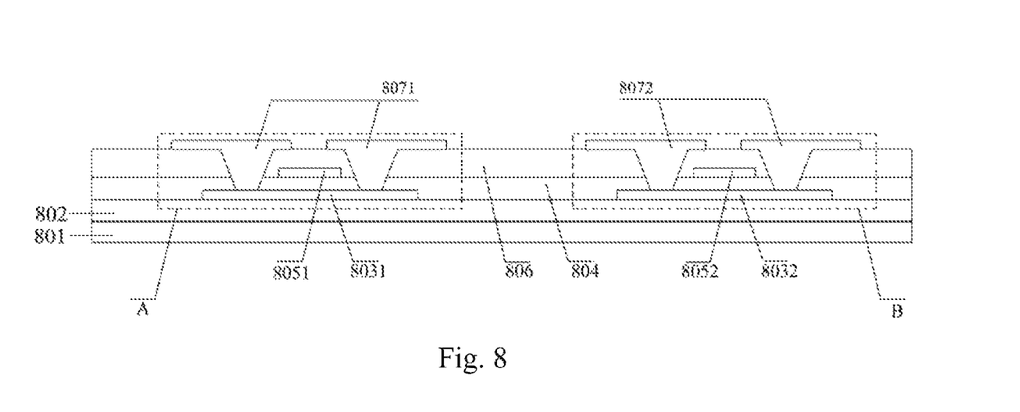
FIG. 8 is a schematic structural diagram of an inverter according to an embodiment of the disclosure.

FIG. 8 illustrates a schematic structural diagram of any one of the first inverter to the sixth inverter in details, and as can be apparent, any one of the inverters includes an base substrate 801, a light-shielding layer (not illustrated) and a buffer layer 802 located on the base substrate 801 successively, a PMOS semiconductor layer 8031 located in a PMOS area A, and an NMOS semiconductor layer 8032 located in an NMOS area B, formed above the buffer layer 802, a gate insulation layer 804 formed on the PMOS semiconductor layer 8031 and the NMOS semiconductor layer 8032, a PMOS gate 8051 located in the PMOS area A, and an NMOS gate 8052 located in the NMOS area B, formed on the gate insulation layer 804, an interlayer medium layer 806 formed on the PMOS gate 8051 and the NMOS gate 8052, and a PMOS source-drain 8071 located in the PMOS area A, and an NMOS source-drain 8072 located in the NMOS area B, formed on the interlayer medium layer 806.

In an optional implementation, an a-Si material layer can be formed on the buffer 802, and laser-crystallized into a poly-Si material layer, and then patterns of the PMOS semiconductor layer 8031 and the NMOS semiconductor layer 8032 can be formed from the poly-Si layer in a patterning process.

Then the gate insulation layer 804 is formed on the PMOS semiconductor layer 8031 and the NMOS semiconductor layer 8032, a gate material is deposited on the gate insulation layer 804, and a pattern of the PMOS gate 8051 located in the PMOS area A, and a pattern of the NMOS gate 8052 located in the NMOS area B can be formed in a patterning process.

Thereafter the PMOS semiconductor layer 8031 is doped with P-type ions, and optionally, a pattern of a doping barrier layer (not illustrated) covering the NMOS area B is formed on the NMOS gate 8052 in a patterning process; and then the P-type ions are injected into the base substrate 801 with the doping barrier layer, and a P-type doped poly-Si layer is formed in the area of the PMOS semiconductor layer 8031 which is not shielded by the PMOS gate 8051; and the doping barrier layer is stripped away after the P-type ions are injected.

Thereafter the NMOS semiconductor layer 8032 is doped with N-type ions in the same particular process as the P-type ion doping process, so a repeated description thereof will be omitted here.

Thereafter LDD and Ch doping processes are performed on the NMOS semiconductor layer 8032 sequentially, and since the LDD and Ch doping processes are similar to the P-type ion doping process, a repeated description thereof will be omitted here.

Next a pattern of the interlayer medium 806 is formed on the PMOS gate 8051 and the NMOS gate 8052; and a pattern of the PMOS source-drain 8071 located in the PMOS area A, and a pattern of the NMOS source-drain 8072 located in the NMOS area B are formed on the interlayer medium 806.

In an optional implementation, when the inverter above is applied to a liquid crystal display panel, patterns of a planarization layer, a first indium tin oxide (ITO) layer, a passivation layer, and a second indium tin oxide layer can be further formed above the PMOS source-drain 8071 and the NMOS source-drain 8072 in that order.

In an optional implementation, when the inverter above is applied to an organic light-emitting display panel, patterns of a planarization layer, a pixel layer, and a pixel definition layer can be further formed above the PMOS source-drain 8071 and the NMOS source-drain 8072 in that order.

Based upon the same inventive idea, an embodiment of the disclosure further provides a display device including the gate driving circuit above, and the display device can be a mobile phone, a tablet computer, a TV set, a monitor, a notebook computer, a digital camera, a navigator, a smart watch, a fitness wrist band, a personal digital assistant, an automatic teller machine, or any other product or component with a display function. All the other components indispensable to the display device shall readily occur to those ordinarily skilled in the art, so a repeated description thereof will be omitted here, and the disclosure will not be limited thereto. Reference can be made to the implementation of the gate driving circuit above according to the embodiment of the disclosure for an implementation of the display device according to the embodiment of the disclosure, and a repeated description thereof will be omitted here.

It shall be noted that in this context, the relationship terms, e.g., "first", "second", etc., are only intended to distinguish one entity or operation from another entity or operation, but not intended to require or suggest any such a real relationship or order between these entities or operations.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A shift register, comprising:
    a first pulling-down circuit connected respectively with a power source terminal, a first signal terminal, a pull-up node, a first pull-down node, a first output signal terminal, and a second output signal terminal, and configured to write a first level of the power source terminal into the first pull-down node under a control of the first level of the power source terminal, and to write a signal of the first signal terminal respectively into the pull-up node, the first output signal terminal, and the second output signal terminal under a control of the first pull-down node; and to avoid a second level of the power source terminal from being written into the first pull-down node, under a control of a second level of the power source terminal to stop the signal of the first signal terminal from being writing into the pull-up node, the first output signal terminal, and the second output signal terminal; and the first level and the second level of the power source terminal are output alternately, thus resulting in a square wave;
    a second pulling down circuit connected respectively with the first signal terminal, the pull-up node, a first node, a second pull-down node, the first output signal terminal, and the second output signal terminal; and
    a first inverter connected respectively with the power source terminal, the first signal terminal, a second signal terminal, and the first node, and configured to provide the first node with the signal of the first signal terminal under the control of the first level of the power source terminal, and to avoid the first signal terminal from being written into the second pull-down node under the control of the first node to stop writing the signal of the first signal terminal into the pull-up node, the first output signal terminal, and the second output signal terminal under the control of the second pull-down node; and to write a signal of the second signal terminal into the first node under the control of the second level of the power source terminal, and to write the signal of the first signal terminal respectively into the pull-up node, the first output signal terminal, and the second output signal terminal under the control of the first node;
    wherein the first inverter comprises: a first switch transistor and a second switch transistor, wherein:
    the first switch transistor has a gate connected with the power source terminal, a first electrode connected with the first signal terminal, and a second electrode connected with the first node; and
    the second switch transistor has a gate connected with the power source terminal, a first electrode connected with the second signal terminal, and a second electrode connected with the first node;
    wherein the first pulling-down circuit comprises: a third switch transistor, a fourth switch transistor, a fifth switch transistor, a sixth switch transistor, and a seventh switch transistor:
    wherein the third switch transistor has a gate directly connected with the first pull-down node, a first electrode connected with the power source terminal, and a second electrode connected with the first pull-down node;
    the fourth switch transistor has a gate directly connected with the power source terminal, a first electrode connected with the power source terminal, and a second electrode connected with the first pull-down node;
    the fifth switch transistor has a gate connected with the first pull-down node, a first electrode connected with the first signal terminal, and a second electrode connected with the pull-up node;
    the sixth switch transistor has a gate directly connected with the first pull-down node, a first electrode connected with the first signal terminal, and a second electrode connected with the first output signal terminal; and
    the seventh switch transistor has a gate connected with the first pull-down node, a first electrode connected with the first signal terminal, and a second electrode connected with the second output signal terminal;
    wherein the second pull-down circuit comprises: an eighth switch transistor, a ninth switch transistor, a tenth switch transistor, an eleventh switch transistor, and a twelfth switch transistor, wherein:
    the eighth switch transistor has a gate directly connected with the second pull-down node, a first electrode connected with the first node, and a second electrode directly connected with the second pull-down node;
    the ninth switch transistor has a gate connected with the first node, a first electrode connected with the first node, and a second electrode directly connected with the second pull-down node;

the tenth switch transistor has a gate connected with the second pull-down node, the first electrode connected with the first signal terminal, and the second electrode connected with the pull-up electrode;

the eleventh switch transistor has a gate connected with the second pull-down node, a first electrode connected with the first signal terminal, and a second electrode connected with the first output signal terminal; and the twelfth switch transistor has a gate connected with the second pull-down node, a first electrode connected with the first signal terminal, and a second electrode connected with the second output signal terminal.

2. The shift register according to claim 1, further comprises: an input circuit input circuit connected respectively with an input signal terminal, the second signal terminal, and the pull-up node, and configured to write the signal of the second signal terminal into the pull-up node under the control of the input signal terminal.

3. The shift register according to claim 2, wherein the input circuit comprises: a thirteenth switch transistor, wherein:

the thirteenth switch transistor has a gate connected with the input signal terminal Input, a first electrode connected with the second signal terminal, and a second electrode connected with the pull-up node.

4. The shift register according to claim 1, further comprises: a reset circuit connected respectively with a reset signal terminal, the first signal terminal, and the pull-up node, and configured to write the signal of the first signal terminal into the pull-up node under a control of the reset signal terminal.

5. The shift register according to claim 4, wherein the reset circuit comprises: a fourteenth switch transistor, wherein the fourteenth switch transistor has a gate connected with the reset signal terminal, a first electrode connected with the first signal terminal, and a second electrode connected with the pull-up node.

6. The shift register according to claim 1, further comprises a restart circuit connected respectively with a restart signal terminal, the first signal terminal, and the pull-up node, and configured to write the signal of the first signal terminal into the pull-up node under a control of the restart signal terminal.

7. The shift register according to claim 6, wherein the restart circuit comprises a fifteenth switch transistor, wherein the fifteenth switch transistor has a gate connected with the restart signal terminal, a first electrode connected with the first signal terminal, and a second electrode connected with the pull-up node.

8. The shift register according to claim 1, further comprises: a pull-down node control circuit respectively with the pull-up node, the first signal terminal, the first pull-down node, and the second pull-down node, and configured to write the signal of the first signal terminal respectively into the first pull-down node and the second pull-down node under the control of the pull-up node.

9. The shift register according to claim 8, wherein the pull-down node control circuit comprises: a sixteenth switch transistor, a seventeenth switch transistor, an eighteenth switch transistor, and a nineteenth switch transistor, wherein:

the sixteenth switch transistor has a gate connected with the pull-up node, a first electrode connected with the first signal terminal, and a second electrode connected with the first pull-down node;

the seventeenth switch transistor has a gate connected with the pull-up node, a first electrode connected with the first signal terminal, and a second electrode connected with the first pull-down node;

the eighteenth switch transistor has a gate connected with the pull-up node, a first electrode connected with the first signal terminal, and a second electrode connected with the second pull-down node; and the nineteenth switch transistor has a gate connected with the pull-up node, a first electrode connected with the first signal terminal, and a second electrode connected with the second pull-down node.

10. The shift register according to claim 1, further comprises: an output circuit respectively with the pull-up node, the first output signal terminal, the second output signal terminal, and a clock signal terminal, and configured to provide the first output signal terminal and the second output signal terminal respectively with a signal of the clock signal terminal under the control of the pull-up node.

11. The shift register according to claim 10, wherein the output circuit comprises: a twentieth switch transistor, a twenty-first switch transistor, and a capacitor, wherein:

the twentieth switch transistor has a gate connected with the pull-up node, a first electrode connected with the clock signal terminal, and a second electrode connected with the first output signal terminal;

the twenty-first switch transistor has a gate connected with the pull-up node, a first electrode connected with the clock signal terminal, and a second electrode connected with the second output signal terminal; and the capacitor has one terminal connected with the pull-up node, and other terminal connected with the first output signal terminal.

12. The shift register according to claim 1, wherein the first switch transistor is a P-type transistor, and the second switch transistor is an N-type transistor; or the first switch transistor is an N-type transistor, and the second switch transistor is a P-type transistor.

13. A gate driving circuit, comprising: a plurality of concentrated shift registers according to claim 1, wherein:

an input signal terminal of a first level of shift register is connected with a frame trigger signal terminal;

an input signal terminal of each of other shift registers than the first level of shift register is connected respectively with a second output signal terminal of a preceding level of shift register adjacent to the each of other shift registers; and the first output signal terminal of the each of levels of shift registers is connected with gate lines of its corresponding row.

14. The gate driving circuit according to claim 13, further comprises: a second inverter, a third inverter, a fourth inverter, a fifth inverter, and a sixth inverter, wherein:

the levels of shift registers are grouped sequentially into a plurality of groups of shift registers so that each group of shift registers comprises ten shift registers, wherein a phase of a first clock signal input to the first level of shift register in each group of shift registers is opposite to a phase of a sixth clock signal input to the sixth level of shift register, a phase of a second clock signal input to the second level of shift register is opposite to a phase of a seventh clock signal input to the seventh level of shift register, a phase of a third clock signal input to the third level of shift register is opposite to a phase of a eighth clock signal input to the eighth level of shift register, a phase of a fourth clock signal input to the fourth level of shift register is opposite to a phase of a ninth clock signal input to the ninth level of shift register, and a phase of a fifth clock signal input to the fifth level of shift register is opposite to a phase of a tenth clock signal input to the tenth level of shift register;

the second inverter is connected with a first clock signal terminal for outputting the first clock signal, the first signal terminal, the second signal terminal, and the sixth level of shift register, and configured to provide the sixth level of shift register with the signal of the first signal terminal under the control of a first level of the first clock signal terminal, and to provide the sixth level of shift register with the signal of the second signal terminal under the control of a second level of the first clock signal terminal, wherein the signal of the first signal terminal, and the signal of the second signal terminal constitute the sixth clock signal;

and the first level and the second level of the first clock signal terminal are output alternately, thus resulting in a square wave;

the third inverter is connected with a second clock signal terminal for outputting the second clock signal, the first signal terminal, the second signal terminal, and the seventh level of shift register, and configured to provide the seventh level of shift register with the signal of the first signal terminal under the control of a first level of the second clock signal terminal, and to provide the seventh level of the shift register with the signal of the second signal terminal under the control of a second level of the second clock signal terminal, wherein the signal of the first signal terminal, and the signal of the second signal terminal constitute the seventh clock signal; and the first level and the second level of the second clock signal terminal are output alternately, thus resulting in a square wave;

the fourth inverter is connected with a third clock signal terminal for outputting the third clock signal, the first signal terminal, the second signal terminal, and the eighth level of shift register, and configured to provide the eighth level of shift register with the signal of the first signal terminal under the control of a first level of the third clock signal terminal, and to provide the eighth level of shift register with the signal of the second signal terminal under the control of a second level of the third clock signal terminal, wherein the signal of the first signal terminal, and the signal of the second signal terminal constitute an eighth clock signal; and the first level and the second level of the third clock signal terminal are output alternately, thus resulting in a square wave;

the fifth inverter is connected with a fourth clock signal terminal for outputting the fourth clock signal, the first signal terminal, the second signal terminal, and the ninth level of shift register, and configured to provide the ninth level of shift register with the signal of the first signal terminal under the control of a first level of the fourth clock signal terminal, and to provide the ninth level of shift register with the signal of the second signal terminal under the control of a second level of the fourth clock signal terminal, wherein the signal of the first signal terminal, and the signal of the second signal terminal constitute the ninth clock signal; and the first level and the second level of the fourth clock signal terminal are output alternately, thus resulting in a square wave; and the sixth inverter is connected with a fifth clock signal terminal for outputting the fifth clock signal, the first signal terminal, the second signal terminal, and the tenth level of shift register, and configured to provide the tenth level of shift register with the signal of the first signal terminal under the control of a first level of the fifth clock signal terminal, and to provide the tenth level of shift register with the signal of the second signal terminal under the control of a second level of the fifth clock signal terminal, wherein the signal of the first signal terminal, and the signal of the second signal terminal constitute a tenth clock signal;

and the first level and the second level of the fourth clock signal terminal are output alternately, thus resulting in a square wave.

15. The gate driving circuit according to claim 14, wherein each of the second inverter, the third inverter, the fourth inverter, the fifth inverter, and the sixth inverter comprises: two switch transistors, wherein:

one of the switch transistors has a gate connected with a corresponding clock signal terminal, a first electrode connected with the first signal terminal, and a second electrode connected with a corresponding shift register; and the other switch transistor has a gate connected with a corresponding clock signal terminal, a first electrode connected with the second signal terminal, and a second electrode connected with a corresponding shift register.

16. A display device, comprising: the gate driving circuit according to claim 13.

* * * * *